US012362235B2

(12) United States Patent
Hsueh et al.

(10) Patent No.: US 12,362,235 B2
(45) **Date of Patent: *Jul. 15, 2025**

(54) BARRIER FREE INTERFACE BETWEEN BEOL INTERCONNECTS

(71) Applicant: Taiwan Semiconductor Manufacturing Company, Ltd., Hsin-Chu (TW)

(72) Inventors: Hsiu-Wen Hsueh, Taichung (TW); Chii-Ping Chen, Hsinchu (TW); Po-Hsiang Huang, Taipei (TW); Ya-Ching Tseng, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/318,917

(22) Filed: May 17, 2023

(65) Prior Publication Data

US 2023/0290678 A1 Sep. 14, 2023

Related U.S. Application Data

(63) Continuation of application No. 17/032,407, filed on Sep. 25, 2020, now Pat. No. 11,694,926.

(Continued)

(51) Int. Cl.
*H01L 21/768* (2006.01)
*H01L 23/535* (2006.01)

(52) U.S. Cl.
CPC .. *H01L 21/76844* (2013.01); *H01L 21/76805* (2013.01); *H01L 21/76834* (2013.01);

(Continued)

(58) Field of Classification Search
CPC ......... H01L 21/76844; H01L 21/76805; H01L 21/76834; H01L 21/7684; H01L 21/76846;

(Continued)

(56) References Cited

U.S. PATENT DOCUMENTS 5,985,753 A * 11/1999 Yu ....................... H01L 21/0337
438/622
6,097,095 A * 8/2000 Chung ............. H01L 21/76801
257/E21.507

(Continued)

FOREIGN PATENT DOCUMENTS

CN 104051424 A 9/2014

OTHER PUBLICATIONS

Zhao, Larry. "All About Interconnects." Semiconductor Engineering, published on Dec. 18, 2017.

(Continued)

*Primary Examiner* — Dale E Page
*Assistant Examiner* — Quovaunda Jefferson
(74) *Attorney, Agent, or Firm* — Eschweiler & Potashnik, LLC

(57) ABSTRACT

The present disclosure relates a method of forming an integrated chip. The method includes forming a first interconnect within a first inter-level dielectric (ILD) layer over a substrate, and forming a second ILD layer over the first ILD layer. The second ILD layer is patterned to form an interconnect opening that exposes the first interconnect. A blocking layer is formed onto the first interconnect. A barrier layer is formed within the interconnect opening and the blocking layer is removed to expose the first interconnect. A second interconnect is formed within the interconnect opening.

20 Claims, 13 Drawing Sheets

Related U.S. Application Data

(60) Provisional application No. 63/015,799, filed on Apr. 27, 2020.

(52) U.S. Cl.
CPC .... *H01L 21/7684* (2013.01); *H01L 21/76846* (2013.01); *H01L 21/76849* (2013.01); *H01L 21/76895* (2013.01); *H01L 23/535* (2013.01)

(58) Field of Classification Search
CPC ......... H01L 21/76849; H01L 21/76895; H01L 21/76832; H01L 21/76804; H01L 21/76843; H01L 23/535; H01L 23/53238; H01L 23/528; H01L 2221/1063; H01L 2221/1073
See application file for complete search history.

(56) References Cited

U.S. PATENT DOCUMENTS 6,509,267 B1 * 1/2003 Woo .................. H01L 21/76801 438/678
6,657,303 B1 12/2003 Wang et al.
7,335,590 B2 2/2008 Suh et al.
7,728,436 B2 6/2010 Whelan et al.
7,977,791 B2 * 7/2011 Chang ............... H01L 21/76834 257/751
9,406,614 B2 * 8/2016 Huang .............. H01L 21/76834
11,694,926 B2 * 7/2023 Hsueh ............... H01L 21/76895 257/774
2005/0153544 A1 7/2005 Suh et al.
2005/0282378 A1 * 12/2005 Fukunaga ............. C23C 16/045 438/622
2006/0043589 A1 3/2006 Iwasaki
2006/0128142 A1 6/2006 Whelan et al.
2006/0202346 A1 9/2006 Shih et al.
2007/0032062 A1 2/2007 Lee et al.
2007/0205482 A1 9/2007 Yang et al.
2008/0220608 A1 * 9/2008 Clevenger ......... H01L 21/76847 257/E23.145
2011/0260271 A1 * 10/2011 Fukui ................ H01L 23/53238 257/E29.323
2012/0074571 A1 3/2012 Lavoie
2020/0098685 A1 * 3/2020 Lee ..................... H01L 21/3212

OTHER PUBLICATIONS

Non-Final Office Action dated Sep. 21, 2021 for U.S. Appl. No. 17/032,407.
Non-Final Office Action dated Mar. 24, 2022 for U.S. Appl. No. 17/032,407.
Final Office Action dated Sep. 23, 2022 for U.S. Appl. No. 17/032,407.
Notice of Allowance dated Feb. 24, 2023 for U.S. Appl. No. 17/032,407.

* cited by examiner 2100
2002
204d
512
510
508
506
214
504
108

2000
2004
2006
204d
502
502c
502b
502a
2002
214
108

BARRIER FREE INTERFACE BETWEEN BEOL INTERCONNECTS

REFERENCE TO RELATED APPLICATIONS

This Application is a Continuation of U.S. application Ser. No. 17/032,407, filed on Sep. 25, 2020, which claims the benefit of U.S. Provisional Application No. 63/015,799, filed on Apr. 27, 2020. The contents of the above-referenced Patent Applications are hereby incorporated by reference in their entirety.

BACKGROUND

Modern day integrated chips comprise millions or billions of semiconductor devices formed on a semiconductor substrate (e.g., a silicon substrate). The semiconductor devices are electrically coupled together by interconnects. The interconnects comprise interconnect wires and interconnect vias disposed within a dielectric structure over a semiconductor substrate. By using interconnects to electrically couple the semiconductor devices together, the semiconductor devices are able to perform logical functions that enable operation of an integrated chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
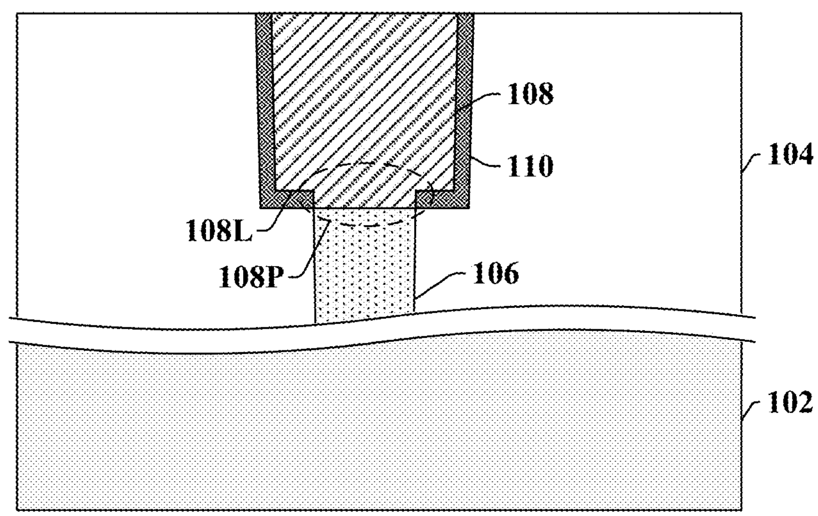
FIG. 1 illustrates a cross-sectional view of some embodiments of an integrated chip having back-end-of-the-line (BEOL) interconnects that meet at a barrier free interface.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips comprise a front-end-of-the-line (FEOL) having devices disposed within a substrate and a back-end-of-the-line (BEOL) having interconnects (e.g., interconnect wires, interconnect vias, etc.) disposed within an inter-level dielectric (ILD) structure over the substrate. The interconnects are electrically coupled to the transistor devices. Over time, a size and distance between the transistor devices has decreased. To be able to connect to the smaller transistor devices, a size of the interconnects has also decreased.

As the size of interconnects get smaller, the distance between adjacent interconnects also gets smaller. The smaller distance between adjacent interconnects causes a capacitance between the adjacent interconnects to increase. Furthermore, as sizes of interconnects decrease it also becomes more difficult for electrical current to move through the interconnects and a resistance of the interconnects increases. Because a product of resistance and capacitance (RC) is inversely proportional to a speed of an integrated chip, interconnects can become a bottleneck to integrated chip speed.

To provide interconnects with a low electrical resistance, a low resistance metal may be used. For example, interconnects are often formed using copper since copper has a low resistance and is easy to work with. However, atoms from some such metals may diffuse into a surrounding ILD structure over time. Metal atoms within the ILD structure can cause conductive paths through the ILD structure and lead to electrical shorting between adjacent interconnects. To prevent diffusion of metal atoms into a surrounding ILD structure, a barrier layer may be formed around the metal. It has been appreciated that the barrier layer may have a significantly higher resistance than the metal, and therefore can negatively impact a resistance of an interconnect structure and lead to performance degradation of an integrated chip.

The present disclosure, in some embodiments, relates to an integrated chip having an interconnect structure that does not have a barrier layer vertically separating an interconnect from an underlying interconnect. In some embodiments, the integrated chip may comprise a first interconnect disposed within an inter-level dielectric (ILD) structure over a substrate and a second interconnect disposed within the ILD structure over the first interconnect. A barrier layer laterally surrounds the second interconnect and separates the second interconnect from the ILD structure. The barrier layer has sidewalls defining an opening directly over the first interconnect.

The second interconnect vertically extends through the opening defined by the sidewalls of the barrier layer to contact an upper surface of the first interconnect. Because the second interconnect extends through the opening in the barrier layer, the barrier layer does not separate the second interconnect from the first interconnect and the barrier layer does not significantly increase a resistance of the interconnect structure.

FIG. 1 illustrates a cross-sectional view of some embodiments of an integrated chip 100 having back-end-of-the-line (BEOL) interconnects that meet at a barrier free interface.

The integrated chip 100 comprises an inter-level dielectric (ILD) structure 104 disposed over a substrate 102. The ILD structure 104 surrounds a plurality of interconnects 106-108. The plurality of interconnects 106-108 comprise a first interconnect 106 and a second interconnect 108 over the first interconnect 106. In some embodiments, the plurality of interconnects 106-108 may comprise a middle-end-of-the-line (MOL) interconnect, a conductive contact, an interconnect wire, and/or an interconnect via. For example, in some embodiments, the first interconnect 106 may comprise an interconnect via and the second interconnect 108 may comprise an interconnect wire.

A barrier layer 110 extends along sidewalls of the second interconnect 108 and laterally separates the second interconnect 108 from the ILD structure 104. The barrier layer 110 is configured to prevent the diffusion of atoms from the second interconnect 108 into the ILD structure 104. In some embodiments, the barrier layer 110 may further extend along a lower surface of the second interconnect 108 and vertically separate the second interconnect 108 from the ILD structure 104. The barrier layer 110 comprises sidewalls that define an opening extending through the barrier layer 110.

The second interconnect 108 vertically extends through the opening in the barrier layer 110 to physically contact an upper surface of the first interconnect 106. In some embodiments, the second interconnect 108 comprises a lower surface 108L resting on the barrier layer 110 and a protrusion 108P extending outward from the lower surface 108L and through the barrier layer 110. The barrier layer 110 may be comprised of a material that has a lower conductivity (e.g., a higher resistivity) than the second conductive material of the second interconnect 108. However, because the second interconnect 108 vertically extends through the barrier layer 110, the barrier layer 110 does not separate the first interconnect 106 from the second interconnect 108. Because the barrier layer 110 does not separate the first interconnect 106 from the second interconnect 108, a resistance between the first interconnect 106 and the second interconnect 108 is reduced. For example, a resistance between the first interconnect 106 and the second interconnect 108 can be reduced by approximately 20% or more relative to interconnects that are separated by a barrier layer. Reducing a resistance between the first interconnect 106 and the second interconnect 108 can improve performance of the integrated chip 100 (e.g., a ring oscillator can realize an improvement in speed of approximately 1.5% or more).

Figure 2A:
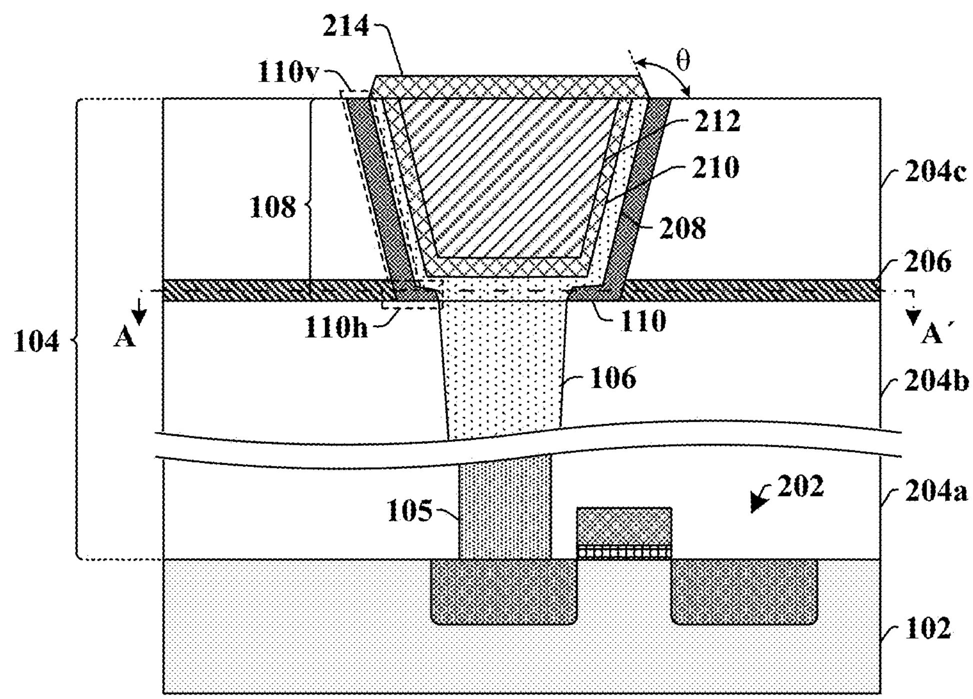
FIGS. 2A-2B illustrate some additional embodiments of an integrated chip having interconnects that meet at a barrier free interface.

FIG. 2A illustrates a cross-sectional view of some additional embodiments of an integrated chip 200 having interconnects that meet at a barrier free interface.

The integrated chip 200 comprises a plurality of interconnects 105-108 disposed within an ILD structure 104 over a substrate 102. In some embodiments, the ILD structure 104 comprises a plurality of stacked inter-level dielectric (ILD) layers 204*a*-204*c*. The plurality of stacked ILD layers 204*a*-204*c* comprise a lower ILD layer 204*a*, a first ILD layer 204*b* over the lower ILD layer 204*a*, and a second ILD layer 204*c* over the first ILD layer 204*b*. In some embodiments, the plurality of stacked ILD layers 204*a*-204*c* may comprise one or more of silicon dioxide, silicon nitride, carbon doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like. In some embodiments, adjacent ones of the plurality of stacked ILD layers 204*a*-204*c* may be separated by an etch stop layer 206. In various embodiments, the etch stop layer 206 may comprise a carbide (e.g., silicon carbide, silicon oxycarbide, or the like), a nitride (e.g., silicon nitride, silicon oxynitride, or the like), or the like.

The plurality of stacked inter-level dielectric (ILD) layers 204*a*-204*c* surround a plurality of interconnects 105-108. In some embodiments, the plurality of interconnects 105-108 comprise a lower interconnect 105, a first interconnect 106 over the lower interconnect 105, and a second interconnect 108 over the first interconnect 106. In some embodiments, the plurality of interconnects 105-108 may comprise one or more of an MOL interconnect, a conductive contact, an interconnect wire, and/or interconnect via. In some embodiments, the lower ILD layer 204*a* surrounds the lower interconnect 105, the first ILD layer 204*b* surrounds the first interconnect 106, and the second ILD layer 204*c* surrounds the second interconnect 108. In some embodiments, the plurality of interconnects 105-108 are coupled to a transistor device 202 arranged within the substrate 102. In some embodiments, the transistor device 202 may comprise a MOSFET (metal oxide semiconductor field-effect transistor) device, a BJT (bipolar junction transistor), a JFET (junction gate field-effect transistor), or the like.

In some embodiments, the first interconnect 106 may comprise and/or be a first conductive material. In some embodiments, the first conductive material may be a material that has a low diffusivity into the surrounding first ILD layer 204*b* (e.g., a diffusivity into the surrounding first ILD layer 204*b* that is less than the diffusivity of copper). In some such embodiments, the first conductive material is not separated from the ILD structure 104 by way of a barrier layer so that first interconnect 106 directly contacts the first ILD layer 204*b*. In some such embodiments, the first conductive material may comprise or be tungsten, ruthenium, cobalt, or the like. In other embodiments (not shown), the first conductive material may be separated from the ILD structure 104 by way of a barrier layer.

The second interconnect 108 is separated from the second ILD layer 204*c* by a barrier layer 110. The barrier layer 110 extends along sidewalls of the second interconnect 108 and has sidewalls directly underlying the second interconnect 108. The sidewalls of the barrier layer 110 define an opening that extends through a lower surface of the barrier layer 110 at a location that is directly over the first interconnect 106. The second interconnect 108 extends through the opening to directly contact an upper surface of the first interconnect 106. In some embodiments, the second interconnect 108 continuously extends between the sidewalls of the barrier layer 110 so that the second interconnect completely fills the opening. In some embodiment, the sidewalls of the barrier layer 110 defining the opening may be separated by a distance that is substantially equal to a width of a top surface of the first interconnect 106. In some such embodiments, a bottom corner of the barrier layer 110 may be aligned with a top corner of the first interconnect 106 along an imaginary line that is perpendicular to an upper surface of the substrate 102.

Figure 2B:
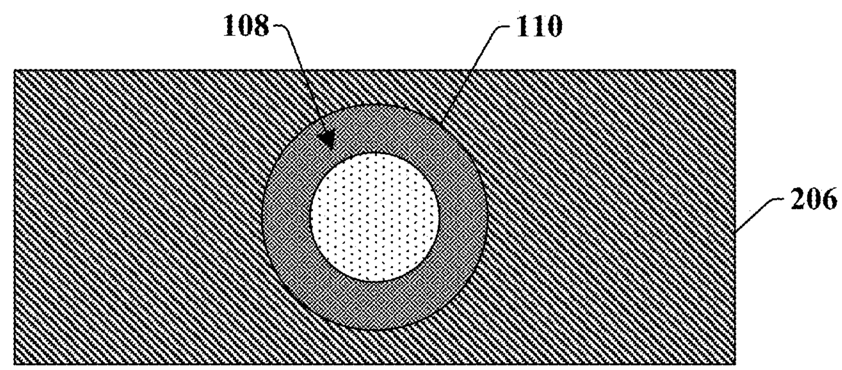

FIG. 2B illustrates some embodiments of a plan-view 216 of the integrated chip 200. As shown in plan-view 216 of FIG. 2B (take along cross-sectional line A-A' of FIG. 2A), the barrier layer 110 extends in a closed loop around the second interconnect 108. In some embodiments, the barrier layer 110 comprises a ring shape that extends around the second interconnect 108.

In some embodiments, the barrier layer 110 comprises a vertically extending segment 110*v* disposed along the sidewalls of the second ILD layer 204*c* and a horizontally extending segment 110*h* protruding outward from a sidewall of the vertically extending segment 110*v* towards the second interconnect 108. In some embodiments, the vertically extending segment 110*v* may be angled at an angle that is greater than 90° with respect to an upper surface of the horizontally extending segment 110*h*. In various embodiments, the barrier layer 110 may comprise tantalum, tantalum nitride, titanium, titanium nitride, or the like.

In some embodiments, the second interconnect 108 comprises a first liner 208 surrounding a conductive interior 212. The first liner 208 is disposed on the barrier layer 110 and vertically extends through the barrier layer 110 to contact the upper surface of the first interconnect 106. In some embodiments, the first liner 208 comprises a lower surface resting on the barrier layer 110 and a protrusion extending outward from the lower surface and through the barrier layer 110. In some embodiments, the first liner 208 completely fills the opening extending through the barrier layer 110, so that a bottommost surface of the conductive interior 212 is above a top surface of the horizontally extending segment 110*h* of the barrier layer 110. In some embodiments, the first liner 208 may comprise a material that has a lower resistivity than the barrier layer 110. In some embodiments, the first liner 208 may comprise or be a same material as the first interconnect 106. For example, in some embodiments, the first liner 208 may comprise ruthenium, cobalt, tungsten, or the like. In some such embodiments, there may be a seam 301 present between the first interconnect 106 and the first liner 208. In other embodiments, the first liner 208 may comprise or be a different material than the first interconnect 106. In some embodiments, the conductive interior 212 may comprise copper, aluminum, or the like.

In some embodiments, a second liner 210 may be disposed between the first liner 208 and the conductive interior 212. The second liner 210 laterally and vertically separates the first liner 208 from the conductive interior 212. In some embodiments, the second liner 210 may comprise and/or be cobalt, ruthenium, tungsten, or the like. In some embodiments, the barrier layer 110, the first liner 208, the second liner 210, and the conductive interior 212 vertically extend to an upper surface of the second ILD layer 204*c*. In some embodiments, the second liner 210 may comprise or be a different material than the first liner 208.

A capping layer 214 is disposed on the second interconnect 108. In some embodiments, the capping layer 214 extends from directly over the conductive interior 212 to directly over the first liner 208 and/or the second liner 210. In some embodiments, the barrier layer 110 is laterally outside of the capping layer 214. The capping layer 214 may comprise and/or be cobalt, ruthenium, tungsten, or the like. In some embodiments, the second liner 210 and the capping layer 214 may comprise and/or be a same material. In other embodiments, the second liner 210 and the capping layer 214 may comprise or be different materials. In some embodiments, the capping layer 214 may comprise a sidewall that is angled at an angle θ with respect to a lower surface of the capping layer 214 as measured through the capping layer 214. In some embodiments, the angle θ may be greater than or equal to approximately 90°. In some embodiments, the angle θ may be greater than 90°.

Figure 3:
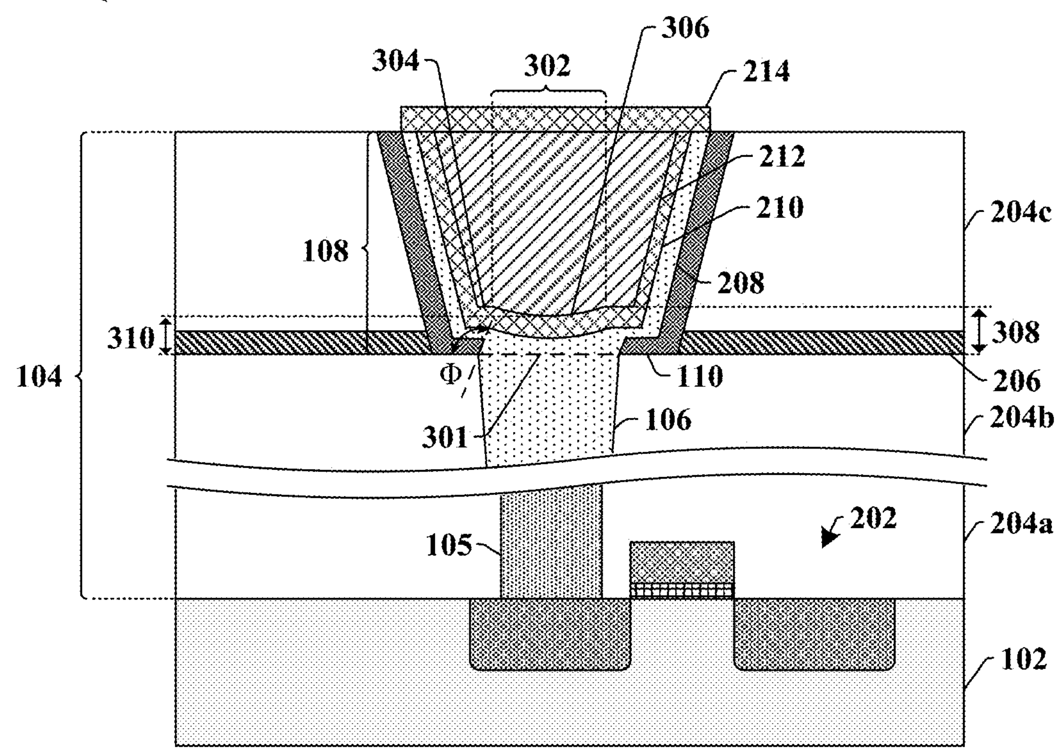
FIG. 3 illustrates a cross-sectional view of some alternative embodiments of an integrated chip having interconnects that meet at a barrier free interface.

FIG. 3 illustrates a cross-sectional view of some alternative embodiments of an integrated chip 300 having interconnects that meet at a barrier free interface.

The integrated chip 300 comprises a ILD structure 104 disposed over a substrate 102. The ILD structure 104 surrounds a lower interconnect 105 disposed within a lower ILD layer 204*a*, a first interconnect 106 disposed within a first ILD layer 204*b*, and a second interconnect 108 disposed within a second ILD layer 204*c*.

The second interconnect 108 is separated from the second ILD layer 204*c* by way of a barrier layer 110 that is arranged along opposing sides of the second interconnect 108. The barrier layer 110 comprises one or more sidewalls disposed directly below the second interconnect 108. In some embodiments, the one or more sidewalls may comprise a sidewall that is angled at an angle Φ with respect to an upper surface of the first ILD layer 204*b* as measured through the barrier layer 110. In some embodiments, the angle Φ may be greater than or equal to approximately 90°. In some embodiments, the angle Φ may be greater than 90°.

The second interconnect 108 extends through the barrier layer 110 to contact an upper surface of the first interconnect 106. In some embodiments, the second interconnect 108 comprises a conductive interior 212 surrounded by a first liner 208. The first liner 208 separates the conductive interior 212 from the barrier layer 110. In some embodiments, the first liner 208 may comprise a horizontally extending segment extending between interior sidewalls of the first liner 208. The horizontally extending segment comprises a first upper surface 304 that is directly over the barrier layer 110. In some embodiments, the horizontally extending segment may further comprise a recessed region 302 that is laterally separated from an interior sidewall of the first liner 208 by the first upper surface 304. The recessed region 302 is directly over the first interconnect 106. In some embodiments, the recessed region 302 is defined by a second upper surface 306 that is recessed below the first upper surface 304. In some embodiments, the first upper surface 304 is separated from the first ILD layer 204*b* by a first distance 308 and the second upper surface 306 is separated from the first interconnect 106 by a second distance 310 that is smaller than the first distance 308. In some embodiments, the second upper surface 306 may comprise a curved surface. In some embodiments, the conductive interior 212 is conformal to the first liner 208 so that the conductive interior 212 is vertically closer to the first interconnect 106 along a center of a bottom of the conductive interior 212 than along bottom outer edges of the conductive interior 212.

Figure 4A:
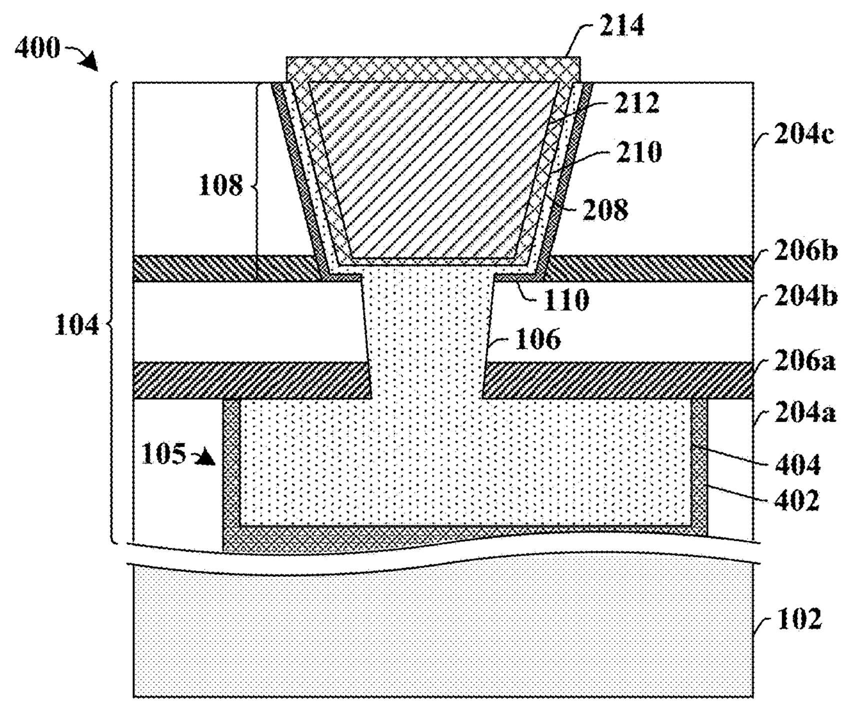
FIGS. 4A-4B illustrate cross-sectional views of some alternative embodiments of an integrated chip having interconnects that meet at a barrier free interface.

FIG. 4A illustrates a cross-sectional view of some alternative embodiments of an integrated chip 400 having interconnects that meet at a barrier free interface.

The integrated chip 400 comprises a lower interconnect 105 disposed over a substrate 102. In some embodiments, the lower interconnect 105 may comprise a lower surface contacting an upper surface of the substrate 102. In other embodiments, the lower interconnect 105 may be separated from the upper surface of the substrate 102 by way of one or more additional interconnect layers. The lower interconnect 105 comprises a lower barrier layer 402 surrounding a conductive core 404. The lower barrier layer 402 continuously extends along sidewalls and a lower surface of the conductive core 404. The lower barrier layer 402 laterally separates the conductive core 404 from a surrounding lower ILD layer 204*a*. In some embodiments, the lower barrier layer 402 may comprise titanium, tantalum, titanium nitride, tantalum nitride, or the like. In some embodiments, the conductive core 404 may comprise ruthenium, tungsten, cobalt, or the like. In some embodiments, the lower ILD layer 204*a* may comprise silicon nitride, silicon dioxide, or the like.

A first ILD layer 204*b* is vertically separated from the lower ILD layer 204*a* by way of a first etch stop layer 206*a*. The first ILD layer 204*b* laterally surrounds a first interconnect 106 disposed over the lower interconnect 105. In some embodiments, the first interconnect 106 may laterally contact sidewalls of the first etch stop layer 206*a* and the first ILD layer 204*b*. In some embodiments, the first interconnect 106 may comprise a same material (e.g., ruthenium, tungsten, cobalt, or the like) as the conductive core 404. In some embodiment, the first interconnect 106 may comprise a single material that continuously extends between outermost sidewalls of the first interconnect 106.

A second interconnect 108 is disposed over the first interconnect 106. The second interconnect 108 is laterally surrounded by a second ILD layer 204*c*. In some embodiments, the second ILD layer 204*c* is separated from the first ILD layer 204*b* by a second etch stop layer 206*b*. The second interconnect 108 comprises a first liner 208, a second liner 210 surrounded by the first liner 208, and a conductive interior 212 surrounded by the second liner 210. In some embodiments, the first liner 208 may comprise a same material as the first interconnect 106 and the conductive core 404. In some such embodiments, a same material continuously extends from an upper surface of the second interconnect 108 to a bottommost surface of the conductive core 404.

Figure 4B:
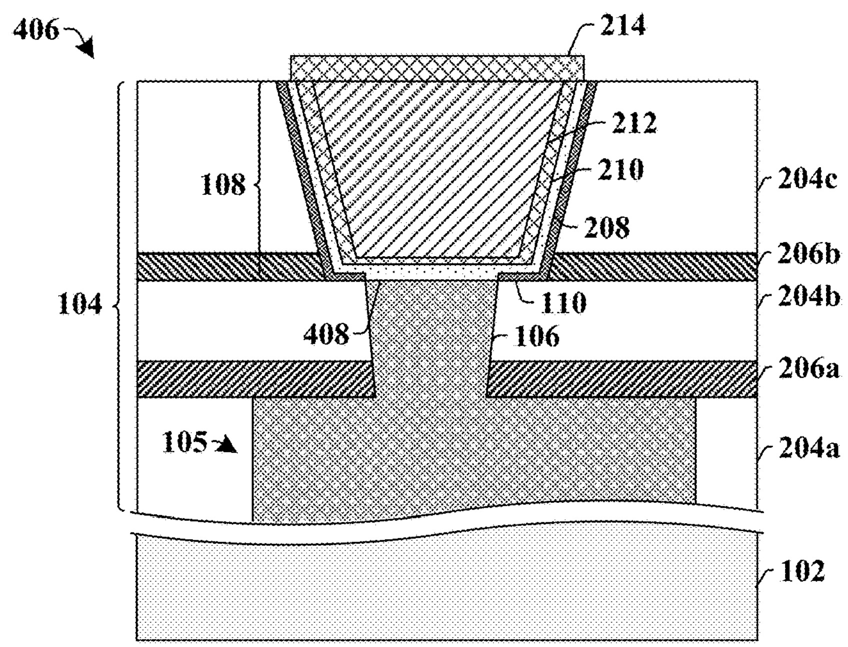

FIG. 4B illustrates a cross-sectional view of some alternative embodiments of an integrated chip 406 having interconnects that meet at a barrier free interface.

The integrated chip 406 comprises a lower interconnect 105 disposed over a substrate 102. In some embodiments, the lower interconnect 105 may comprise a lower surface contacting an upper surface of the substrate 102. In other embodiments, the lower interconnect 105 may be separated from the upper surface of the substrate 102 by way of one or more additional interconnect layers. In some embodiments, the lower interconnect 105 may laterally contact sidewalls a lower ILD layer 204*a*. In some embodiment, the lower interconnect 105 may comprise a single material that continuously extends between outermost sidewalls of the lower interconnect 105. In some embodiments, the single material may comprise ruthenium, tungsten, cobalt, or the like.

A first ILD layer 204*b* is vertically separated from the lower ILD layer 204*a* by way of a first etch stop layer 206*a*. The first ILD layer 204*b* laterally surrounds a first interconnect 106 disposed over the lower interconnect 105. In some embodiments, the first interconnect 106 may laterally contact sidewalls of the first etch stop layer 206*a* and the first ILD layer 204*b*. In some embodiments, the first interconnect 106 may comprise a same material (e.g., ruthenium, tungsten, cobalt, or the like) as the lower interconnect 105. In some embodiment, the first interconnect 106 may comprise a single material that continuously extends between outermost sidewalls of the first interconnect 106.

A second interconnect 108 is disposed over the first interconnect 106. The second interconnect 108 is laterally separated from a second ILD layer 204*c* by a barrier layer 110. The second interconnect 108 comprises a first liner 208, a second liner 210 surrounded by the first liner 208, and a conductive interior 212 surrounded by the second liner 210.

In some embodiments, the first liner 208 may comprise a different material than the first interconnect 106. For example, in some embodiments, the first liner may comprise ruthenium and the first interconnect may comprise tungsten. In some such embodiments, an interface 408 between the first interconnect 106 and the first liner 208 is substantially aligned with a bottom surface of the barrier layer 110.

Figure 5:
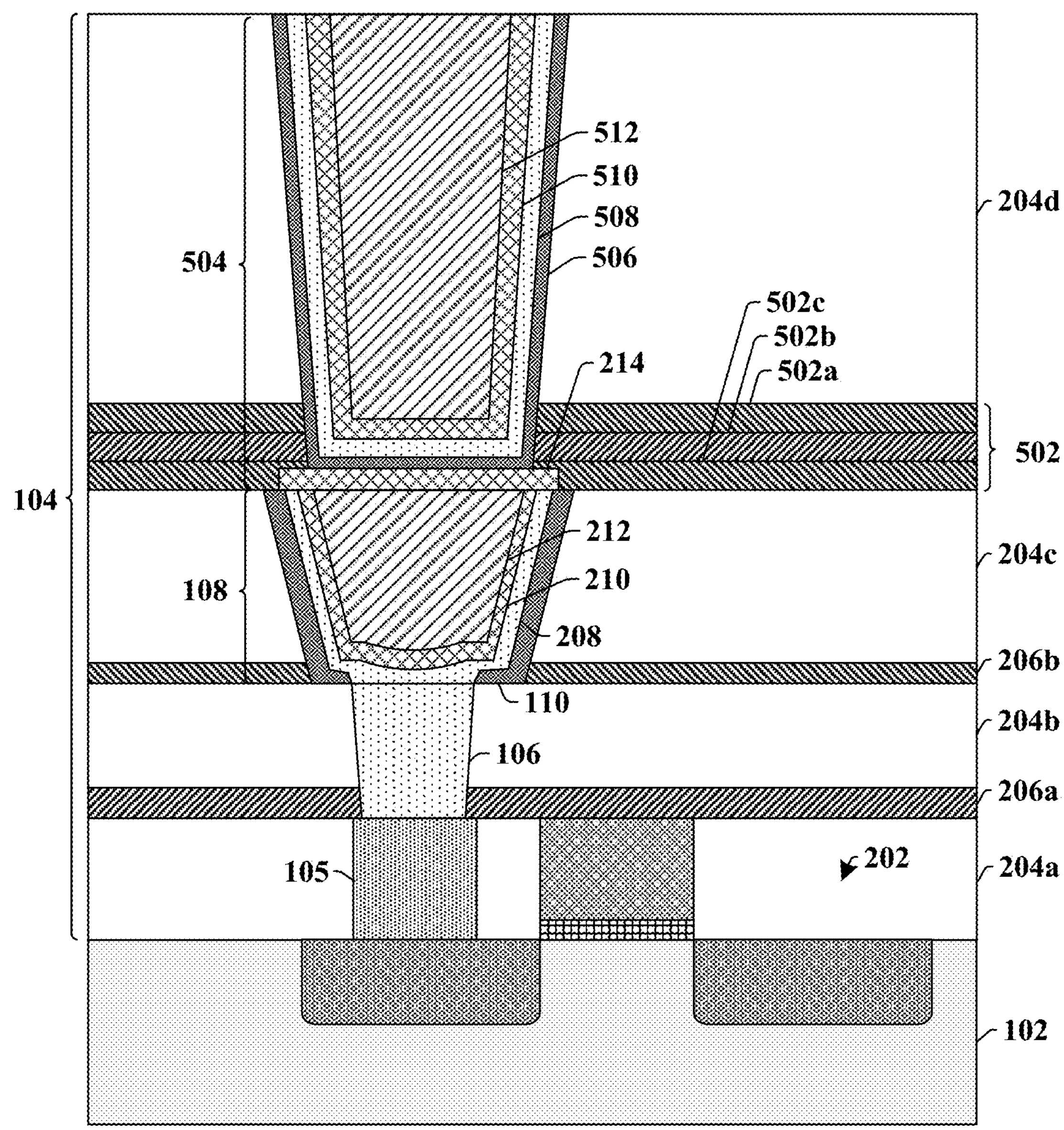
FIG. 5 illustrates a cross-sectional view of some alternative embodiments of an integrated chip having interconnects that meet at a barrier free interface.

FIG. 5 illustrates a cross-sectional view of some alternative embodiments of an integrated chip 500 having interconnects that meet at a barrier free interface.

The integrated chip 500 comprises a lower interconnect 105 disposed within a lower ILD layer 204*a* on a substrate 102. In some embodiments, the lower interconnect 105 contacts a transistor device 202 arranged on and/or within an upper surface of the substrate 102. A first interconnect 106 is disposed within a first ILD layer 204*b* that is over the lower ILD layer 204*a*. A second interconnect 108 is disposed over the first interconnect 106. The second interconnect 108 is laterally separated from a second ILD layer 204*c* by a barrier layer 110. The second interconnect 108 vertically extends through a lower surface of the barrier layer 110 to contact an upper surface of the first interconnect 106. A capping layer 214 is disposed along an upper surface of the second interconnect 108.

An upper ILD layer 204*d* is vertically separated from the second ILD layer 204*c* by way of an upper etch stop layer 502. In some embodiments, the upper etch stop layer 502 may comprise a multi-layer etch stop layer. In some such embodiments, the upper etch stop layer 502 may comprise a first material 502*a*, a second material 502*b* disposed on the first material 502*a*, and a third material 502*c* disposed on the second material 502*b*. In some embodiments, the first material 502*a* may be a same material as the third material 502*c* and a different material than the second material 502*b*. In some embodiments, the first material 502*a*, the second material 502*b*, and the third material 502*c* may comprise or be an oxide (e.g., silicon oxide), a nitride (e.g., silicon nitride), a carbide (e.g., silicon carbide), or the like.

The upper ILD layer 204*d* surrounds an upper interconnect 504. The upper interconnect 504 vertically extends from a top of the upper ILD layer 204*d* to the capping layer 214. In some embodiments, the upper interconnect 504 comprises a first upper liner 508, a second upper liner 510 surrounded by the first upper liner 508, and an upper conductive interior 512 surrounded by the second upper liner 510. In some embodiments, the upper interconnect 504 is surrounded by an upper barrier layer 506. In some embodiments, the upper barrier layer 506 continuously extends along a bottom surface of the upper interconnect 504 and from a first sidewall of the upper interconnect 504 to an opposing second sidewall of the upper interconnect 504.

FIGS. 6-21 illustrate cross-sectional views 600-2100 of some embodiments of a method of forming an integrated chip having interconnects that meet at a barrier free interface. Although FIGS. 6-21 are described in relation to a method, it will be appreciated that the structures disclosed in FIGS. 6-21 are not limited to such a method, but instead may stand alone as structures independent of the method.

Figure 6:
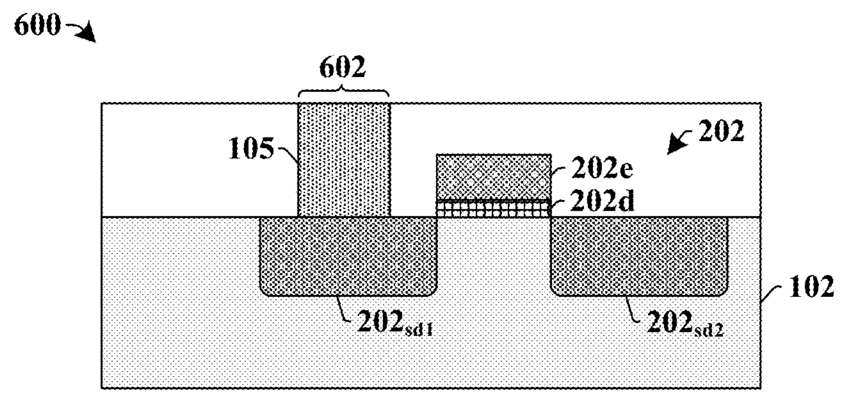
FIGS. 6-21 illustrate cross-sectional views of some embodiments of a method of forming an integrated chip having interconnects that meet at a barrier free interface.

As shown in cross-sectional view 600 of FIG. 6, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, a transistor device 202 is formed on and/or within the substrate 102. In some such embodiments, the transistor device 202 may be formed by depositing a gate dielectric film and a gate electrode film over the substrate 102. The gate dielectric film and the gate electrode film are subsequently patterned to form a gate dielectric **202*d* and a gate electrode 202*e*. The substrate 102 may be subsequently implanted to form source/drain regions $\mathbf{202}_{sd1}$-$\mathbf{202}_{sd2}$ within the substrate 102 and on opposing sides of the gate electrode 202*e***.

In some embodiments, a lower interconnect 105 may be formed within a lower ILD layer **204*a* formed over the substrate 102. In some embodiments, the lower interconnect 105 may comprise a MOL interconnect or a conductive contact. In some embodiments, the lower interconnect 105 may be formed by forming the lower ILD layer 204*a* over the substrate 102, selectively etching the lower ILD layer 204*a* to form a lower interconnect opening 602 within lower ILD layer 204*a*, forming a first conductive material (e.g., copper, aluminum, etc.) within the lower interconnect opening 602, and performing a first planarization process (e.g., a chemical mechanical planarization process) to remove excess of the first conductive material from over the lower ILD layer 204*a***.

Figure 7:
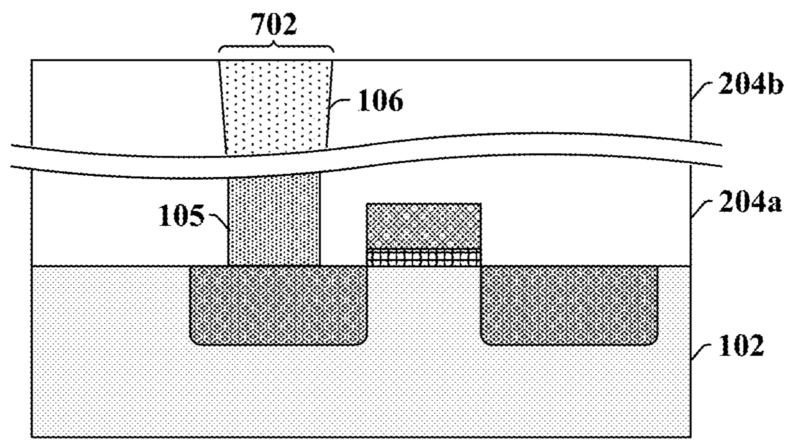

As shown in cross-sectional view 700 of FIG. 7, a first ILD layer **204*b* is formed over the lower ILD layer 204*a*. A first interconnect 106 is subsequently formed within the first ILD layer 204*b* and over the lower interconnect 105. In some embodiments, the first interconnect 106 may be formed by forming the first ILD layer 204*b* over the lower ILD layer 204*a*, selectively etching the first ILD layer 204*b* to form a first interconnect opening 702 within the first ILD layer 204*b*, forming a second conductive material (e.g., copper, aluminum, etc.) within the first interconnect opening 702, and performing a second planarization process (e.g., a chemical mechanical planarization process) to remove excess of the second conductive material from over the first ILD layer 204*b***. In various embodiments, the second conductive material may comprise tungsten, ruthenium, cobalt, or the like.

Figure 8:
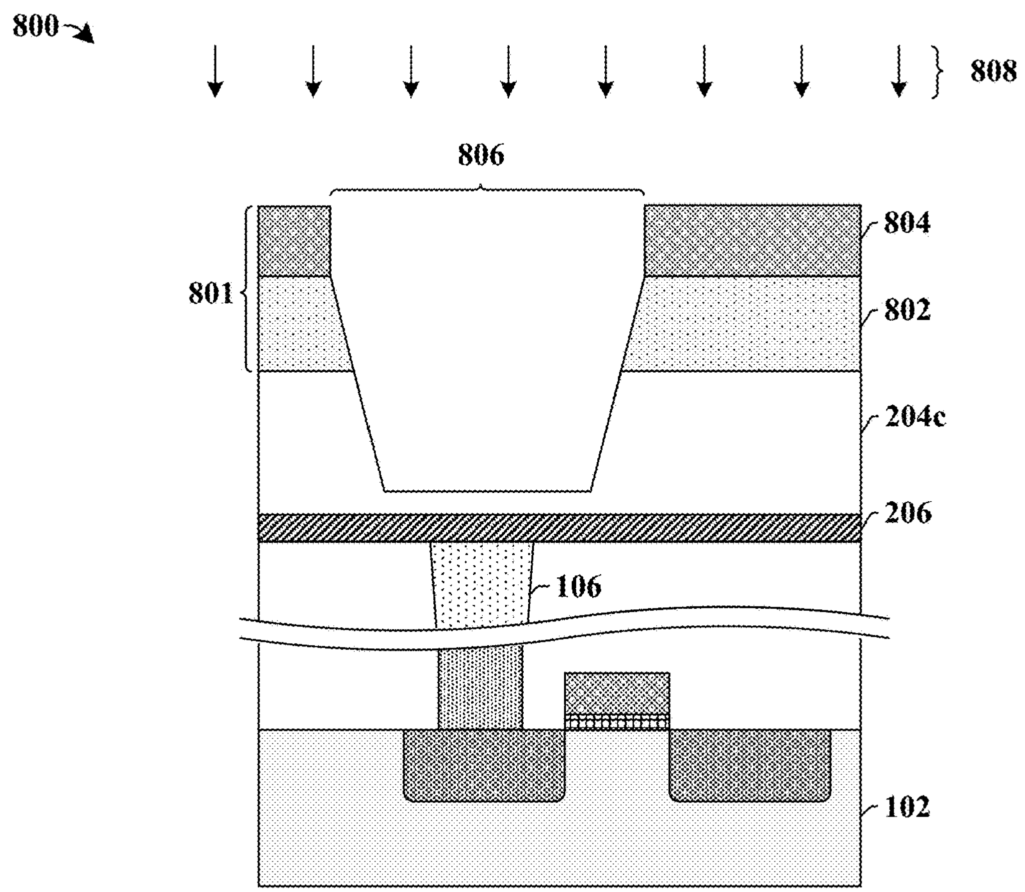

As shown in cross-sectional view 800 of FIG. 8, a second ILD layer **204*c* is formed over the first ILD layer 204*b*. In some embodiments, an etch stop layer 206 may be formed over the first ILD layer 204*b* prior to forming the second ILD layer 204*c*. In various embodiments, the etch stop layer 206 and/or the second ILD layer 204*c*** may be formed by way of deposition processes (e.g., ALD processes, CVD processes, PE-CVD processes, or the like).

A first masking structure 801 is formed over the second ILD layer **204*c*. In some embodiments, the first masking structure 801 may comprise a photosensitive material (e.g., a photoresist). In other embodiments, the first masking structure 801 may comprise a dielectric masking layer 802 and a hard mask 804 over the dielectric masking layer 802. In some embodiments, the dielectric masking layer 802 may comprise an oxide (e.g., silicon oxide, silicon dioxide, or the like). In some embodiments, the hard mask 804** may comprise a carbide (e.g., silicon carbide, silicon oxycarbide, or the like), a nitride (e.g., silicon nitride, silicon oxynitride, titanium nitride, or the like), an oxide (e.g., silicon oxide, titanium oxide, or the like), or the like.

A first etching process is performed to selectively etch the second ILD layer **204*c* according to the first masking structure 801 and to define an intermediate interconnect opening 806. The intermediate interconnect opening 806 is defined by sidewalls and a horizontally extending surface of the second ILD layer 204*c*. In some embodiments, the second ILD layer 204*c* may be selectively patterned by exposing the second ILD layer 204*c* to a first etchant 808 in areas exposed by the first masking structure 801. In some embodiments, the first etchant 808 may comprise a dry etchant (e.g., having a fluorine chemistry, a chlorine chemistry, or the like). In other embodiments, the first etchant 808** may comprise a wet etchant (e.g., comprising hydrofluoric acid, potassium hydroxide, or the like).

Figure 9:
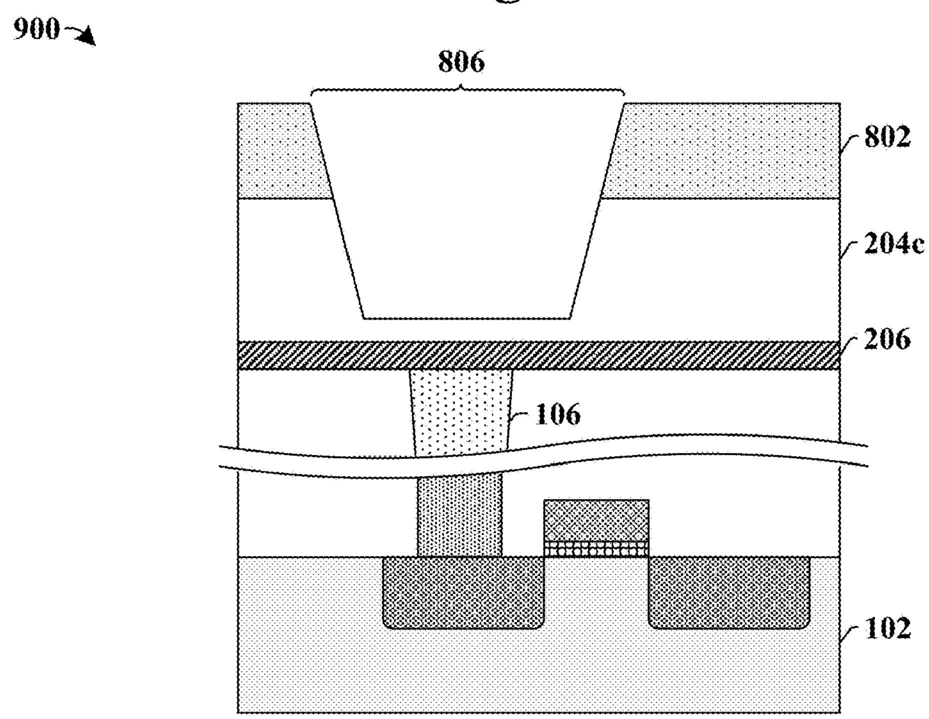

As shown in cross-sectional view 900 of FIG. 9, a part of the first masking structure 801 is removed. In some embodiments, the hard mask (804 of FIG. 8) may be removed while keeping the dielectric masking layer 802 in place over the second ILD layer **204*c*. In various embodiments, the hard mask (804 of FIG. 8**) may be removed by way of an etching process, a planarization process (e.g., a chemical mechanical polishing (CMP) process), or the like.

Figure 10:
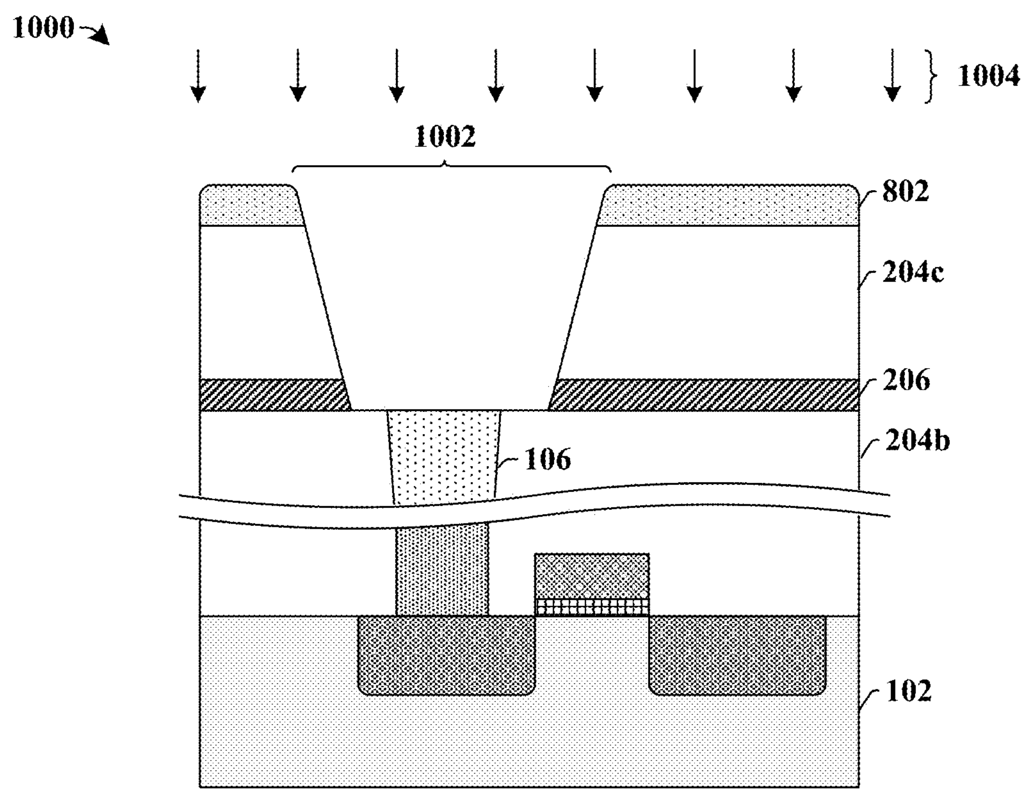

As shown in cross-sectional view 1000 of FIG. 10, the second ILD layer **204*c* and the etch stop layer 206 are further etched according to a second etching process to form a second interconnect opening 1002. In some embodiments, the second interconnect opening 1002 exposes an upper surface of the first interconnect 106. In some embodiments, the second interconnect opening 1002 further exposes an upper surface of the first ILD layer 204*b*. In some embodiments, the second etching process may expose the second ILD layer 204*c* and the first etch stop layer 206*a* to a second etchant 1004 according to the dielectric masking layer 802**. In some embodiments, the second etching process may comprise a linear removal method (LRM).

In some alternative embodiments (not shown), the second ILD layer **204*c* may be etched according to a single etching process. In some additional embodiments, the second ILD layer 204*c* and the etch stop layer 206 may be etched according to separate etching processes that use different etchants. For example, in some embodiments, a first single etching process may etch through the second ILD layer 204*c* to expose the etch stop layer 206, while a second single etching process may etch through the etch stop layer 206 to expose the upper surface of the first interconnect 106**.

Figure 11:
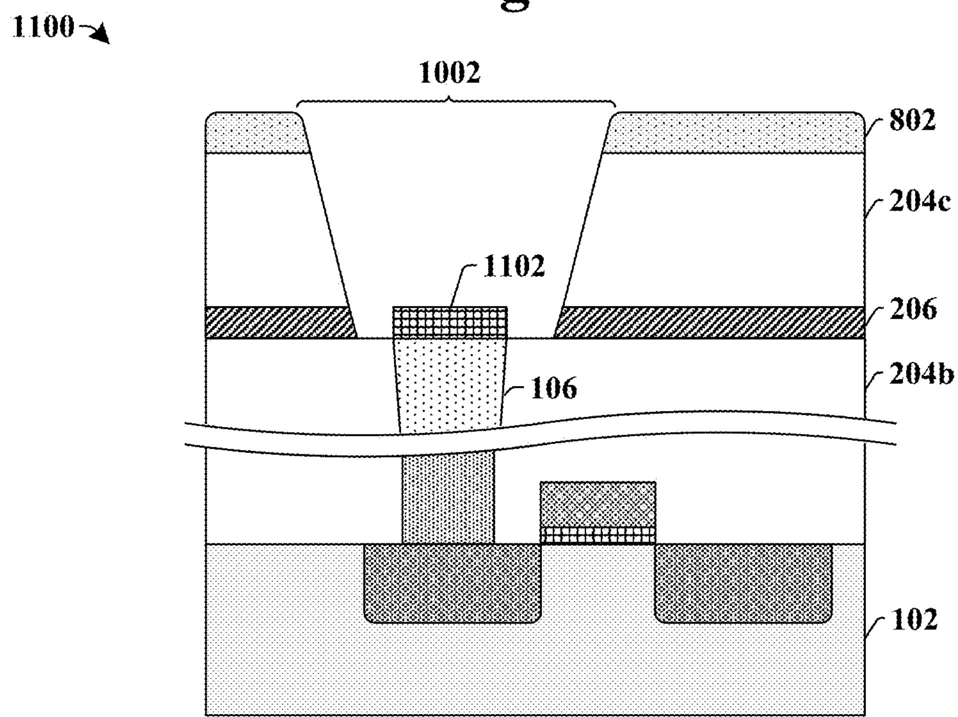

As shown in cross-sectional view 1100 of FIG. 11, a blocking layer 1102 is formed within the second interconnect opening 1002 and on the upper surface of the first interconnect 106. In some embodiments, the blocking layer 1102 is laterally separated from sidewalls of the etch stop layer 206 and/or the second ILD layer **204*c*. In some additional embodiments, the blocking layer 1102 is confined over the upper surface of the first interconnect 106 so that the upper surface of the first ILD layer 204*b* is exposed between sidewalls of the blocking layer 1102 and sidewalls of the second ILD layer 204*c***.

In some embodiments, the blocking layer 1102 may comprise a self-assembled monolayer (SAM). In some embodiments, the self-assembled monolayer may comprise an organic material. For example, the blocking layer 1102 may comprise a silane (e.g., a chlorosilane, an alkoxysilane, an organosilane, or the like), a thiolate (e.g., an organothiolate), or the like. In some embodiments, the self-assembled monolayer may be formed by way of a spin-on process. In some embodiments, the blocking layer 1102 may be formed to a thickness in a range of between approximately 10 Angstroms (Å) and approximately 30 Å. In other embodiments, the blocking layer 1102 may be formed to a thickness in a range of between approximately 15 A and approximately 25 Å, between approximately 20 Å and approximately 30 Å, or other suitable values.

Figure 12:
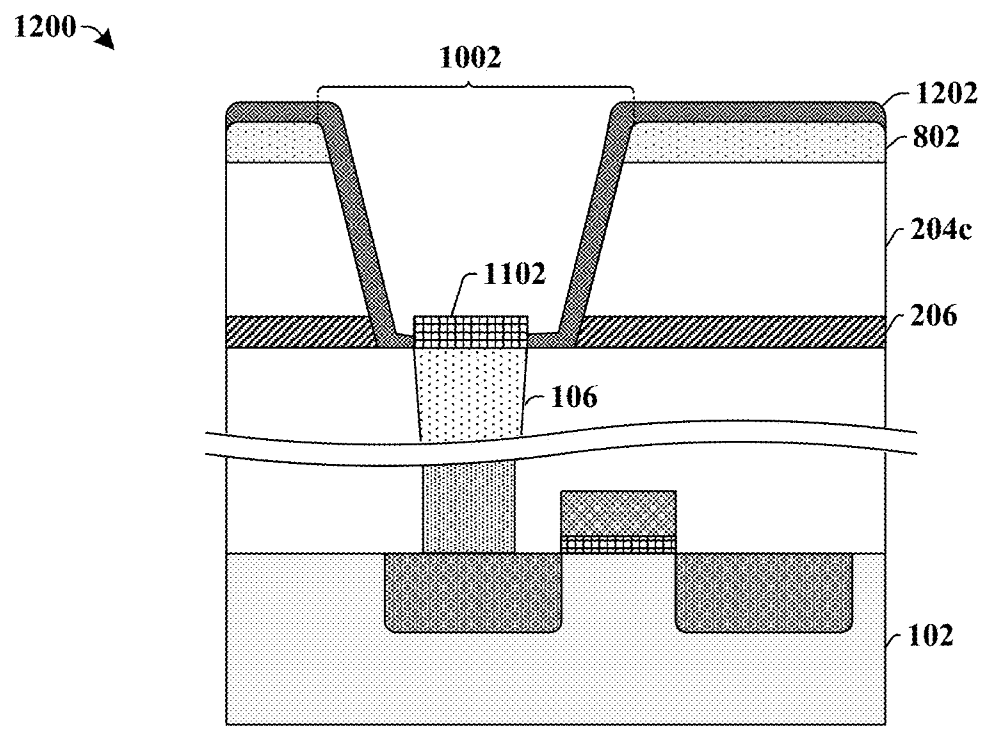

As shown in cross-sectional view 1200 of FIG. 12, a barrier layer 1202 is selectively formed within the second interconnect opening 1002. In some embodiments, the blocking layer 1102 is configured to act as a mask that prevents formation of the barrier layer 1202 onto the upper surface of the first interconnect 106. The barrier layer 1202 covers surfaces of one or more of the first ILD layer 204*b*, the second ILD layer 204*c*, and/or the first interconnect 106. The barrier layer 1202 is not formed onto surfaces of the blocking layer 1102, so that the blocking layer 1102 has one or more surfaces exposed after formation of the barrier layer 1202. In some embodiments, the barrier layer 1202 may be formed to a thickness in a range of between approximately 10 A and approximately 20 Å. In other embodiments, the barrier layer 1202 may be formed to a thickness in a range of between approximately 10 Å and approximately 15 Å, between approximately 15 Å and approximately 20 Å, or other suitable values.

In some embodiments, the barrier layer 1202 may be selectively formed by way of an atomic layer deposition (ALD) process. In such embodiments, the ALD process may be performed by performing a plurality of ALD cycles. The plurality of ALD cycles respective introduce a first precursor gas into a processing chamber holding the substrate 102, purge the processing chamber to evacuate the first precursor gas from the processing chamber, introduce a second precursor gas into the processing chamber, and subsequently purge the processing chamber to evacuate the second precursor gas from the processing chamber. The blocking layer 1102 is inert to the first precursor, so that the first precursor does not adhere to the blocking layer 1102. Rather, the first precursor gas selectively forms onto one or more surfaces of the first ILD layer 204*b*, the second ILD layer 204*c*, and/or the etch stop layer 206. The second precursor gas interacts with the first precursor gas to form a monolayer of the barrier layer 1202 on the one or more surfaces of the first ILD layer 204*b*, the second ILD layer 204*c*, and/or the etch stop layer 206. Because the first precursor gas does not form on the blocking layer 1102, the monolayer is not formed on the blocking layer 1102.

Figure 13:
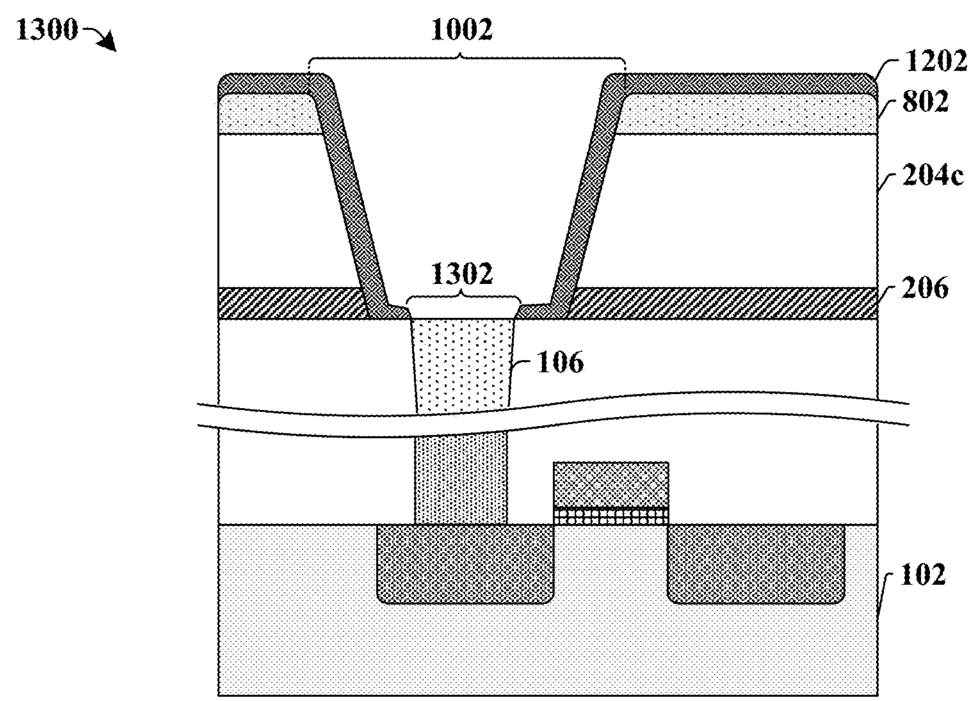

As shown in cross-sectional view 1300 of FIG. 13, the blocking layer (1102 of FIG. 12) is removed. Removing the blocking layer (1102 of FIG. 12) exposes the upper surface of the first interconnect 106 and leaves an opening 1302 extending through the barrier layer 1202 to the first interconnect 106. In some embodiments, the blocking layer (1102 of FIG. 12) may be removed by exposing the blocking layer (1102 of FIG. 12) to a plasma. For example, in some embodiments, the blocking layer (1102 of FIG. 12) may be removed by exposing the blocking layer to a hydrogen based plasma (e.g., an $H_2$ plasma). In some embodiments, because sidewalls of the barrier layer 1202 are defined by the blocking layer (1102 of FIG. 12) rather than an etching process, one or more of the sidewalls of the barrier layer 1202 defining the opening 1302 may be angled at an obtuse angle with respect to an upper surface of the first ILD layer 204*b* as measured through the barrier layer 110. In other embodiments, one or more of the sidewalls of the barrier layer 1202 defining the opening 1302 may be angled at a right angle or at an acute angle with respect to the upper surface of the first ILD layer 204*b* as measured through the barrier layer 110. As shown in cross-sectional view 1400 of FIG. 14, a first liner layer 1402 is formed within the second interconnect opening 1002. The first liner layer 1402 is formed over the barrier layer 1202 and extends through the opening 1302 in the barrier layer 1202 to contact the first interconnect 106. In various embodiments, the first liner layer 1402 may comprise ruthenium, tungsten, cobalt, or the like. In some embodiments, the first liner layer 1402 may be formed by way of a deposition process (e.g., an ALD process, a CVD process, a PE-CVD process, or the like). In some embodiments, the first liner layer 1402 may be formed to a thickness in a range of between approximately 5 Å and approximately 15 Å, between approximately 10 Å and approximately 15 Å, or other suitable values.

Figure 15:
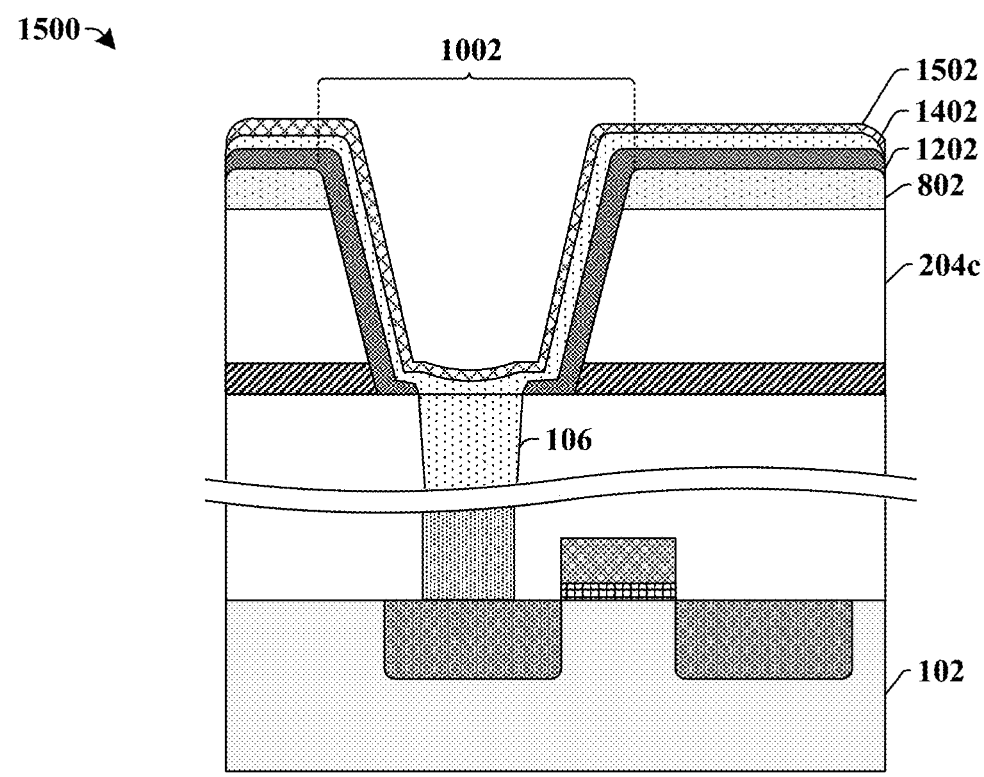

As shown in cross-sectional view 1500 of FIG. 15, a second liner layer 1502 is formed within the second interconnect opening 1002 and over the first liner layer 1402. In some embodiments, the second liner layer 1502 layer may comprise cobalt, tungsten, ruthenium, or the like. In some embodiments, the second liner layer 1502 may comprise a different material than the first liner layer 1402. In various embodiments, the second liner layer 1502 may be formed by way of a deposition process (e.g., an ALD process, a CVD process, a PE-CVD process, or the like). In some embodiments, the second liner layer 1502 may be formed to a thickness in a range of between approximately 5 Å and approximately 15 Å, between approximately 10 Å and approximately 15 Å, or other suitable values.

Figure 16:
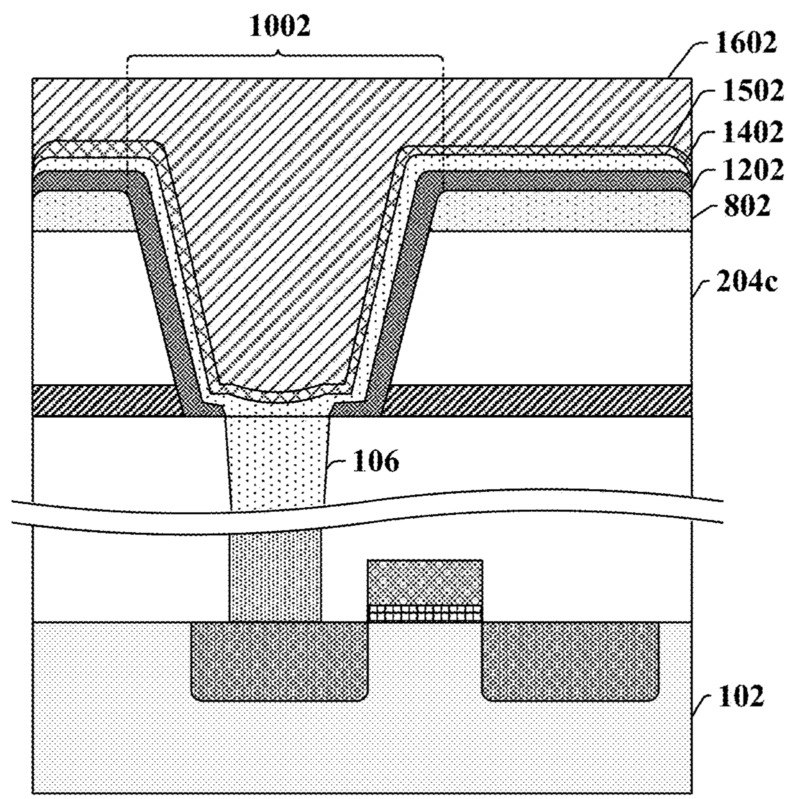

As shown in cross-sectional view 1600 of FIG. 16, a third conductive material 1602 is formed within the second interconnect opening 1002 and over the second liner layer 1502. In some embodiments, the third conductive material 1602 may be formed using a deposition process and/or a plating process (e.g., electroplating, electro-less plating, etc.). In various embodiments, the third conductive material 1602 may comprise copper, aluminum, or the like.

Figure 17:
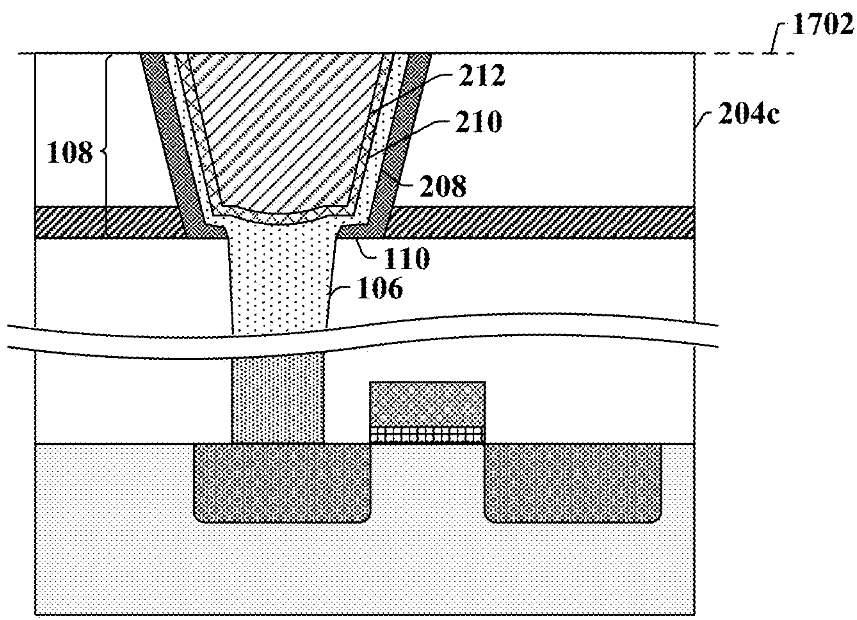

As shown in cross-sectional view 1700 of FIG. 17, a planarization process is performed. The planarization process is performed along line 1702 to remove a part of the third conductive material (1602 of FIG. 16) from over the second ILD layer 204*c* and to define a second interconnect 108. In some embodiments, the planarization process also removes parts of the barrier layer (1202 of FIG. 16), the first liner layer (1402 of FIG. 16), and the second liner layer (1502 of FIG. 16). The second interconnect 108 comprises a first liner 208 that contacts the first interconnect 106, a second liner 210 that is surrounded by the first liner 208, and a conductive interior 212 that is surrounded by the second liner 210. In some embodiments, the planarization process may comprise a chemical mechanical polishing (CMP) process. In some embodiments, the planarization process causes upper surfaces of the barrier layer 110, the first liner 208, the second liner 210, and the conductive interior 212 to be substantially coplanar (e.g., to be coplanar within a tolerance of a CMP process) with an upper surface of the second ILD layer 204*c*.

Figure 18:
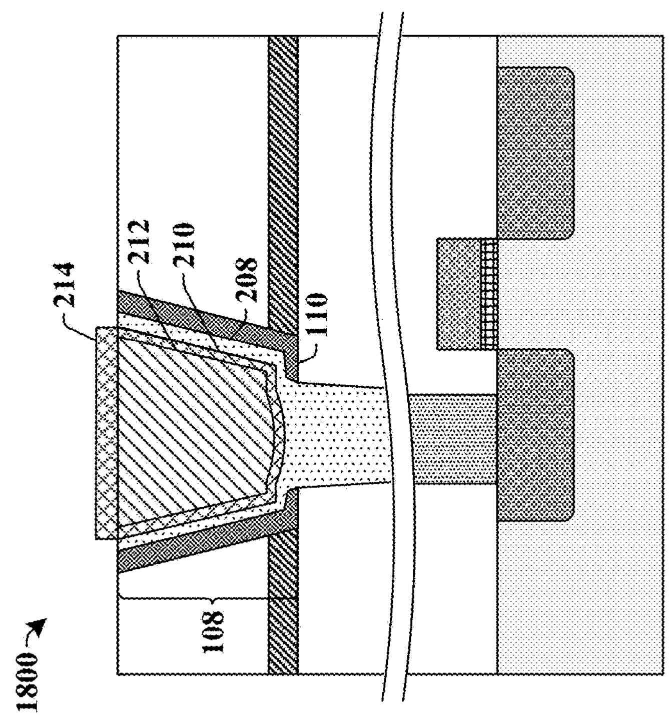

As shown in cross-sectional view 1800 of FIG. 18, a capping layer 214 is formed over the second interconnect 108. In some embodiments, the capping layer 214 may be formed by a plurality of deposition cycles that respectively form a sub-layer of the capping layer 214. In some embodiments, the plurality of deposition cycles may respectively be performed by depositing a metal over the second interconnect 108 followed by a plasma treatment. In some embodiments, the metal may comprise cobalt, ruthenium, tungsten, or the like. In some embodiments, the plasma treatment may be performed by exposing the deposited metal to a plasma comprising nitrogen, hydrogen, or the like. In some embodiments, the plasma may comprise an ammonia ($NH_3$) based plasma. In some embodiments, the capping layer 214 may be formed to a thickness in a range of between approximately 20 Å and approximately 30 Å, between approximately 20 Å and approximately 25 Å, or other suitable values.

In some embodiments, the capping layer 214 may be formed to be completely confined over the second liner 210 and the conductive interior 212. In some such embodiments, the capping layer 214 may have a maximum width that is substantially equal to a maximum width of the second liner 210. In other embodiments, the capping layer 214 may be formed to be completely confined over the first liner 208, the second liner 210, and the conductive interior 212. In some such embodiments, the capping layer 214 may have a maximum width that is substantially equal to a maximum width of the first liner 208. In yet other embodiments, the capping layer 214 may be formed to continuously extend past opposing outermost edges of the first liner 208.

Figure 19:
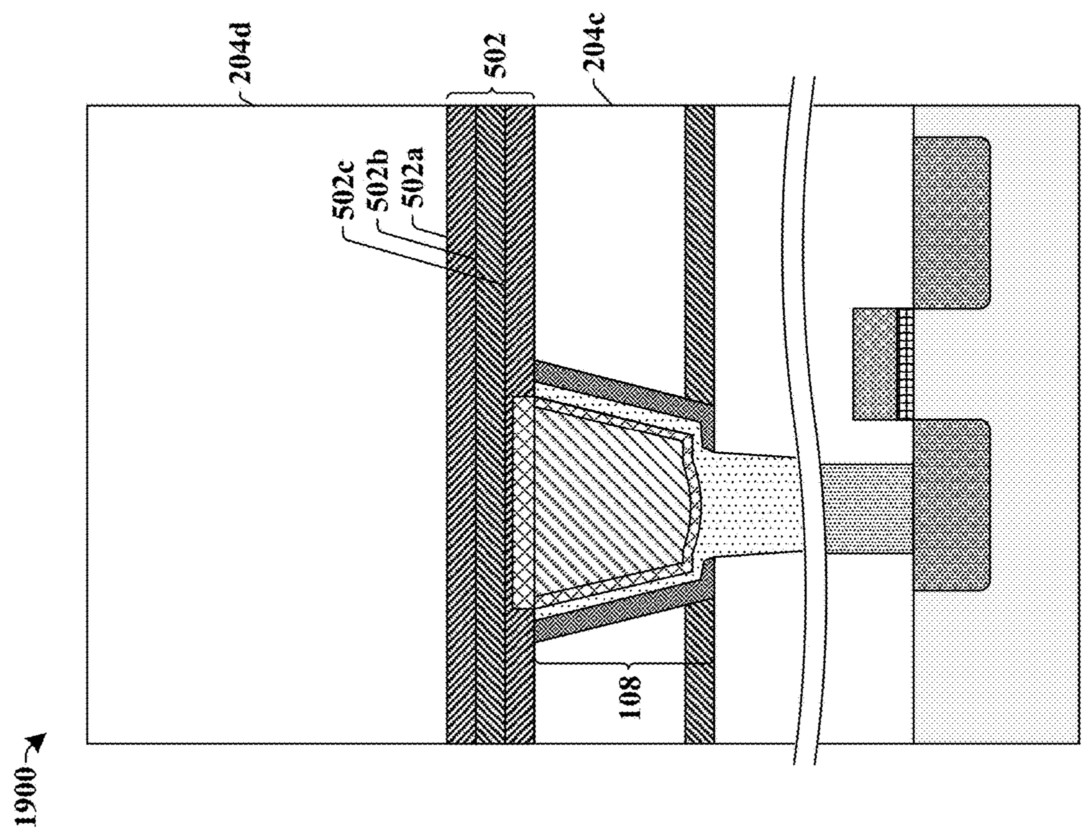

As shown in cross-sectional view 1900 of FIG. 19, an upper ILD layer 204*d* is formed over the second ILD layer 204*c*. In various embodiments, the upper ILD layer 204*d* may be formed by way of a deposition process (e.g., an ALD process, a CVD process, a PE-CVD process, or the like). In some embodiments, an upper etch stop layer 502 may be formed onto the second ILD layer 204*c* prior to forming the upper ILD layer 204*d*. In some embodiments, the upper etch stop layer 502 may comprise a multi-layer etch stop layer having a first material 502*a*, a second material 502*b* over the first material 502*a*, and a third material 502*c* over the second material 502*b*. In some embodiments, the first material 502*a*, the second material 502*b*, and the third material 502*c* may comprise one or more of an oxide, a nitride, or a carbide.

Figures 20, 21:
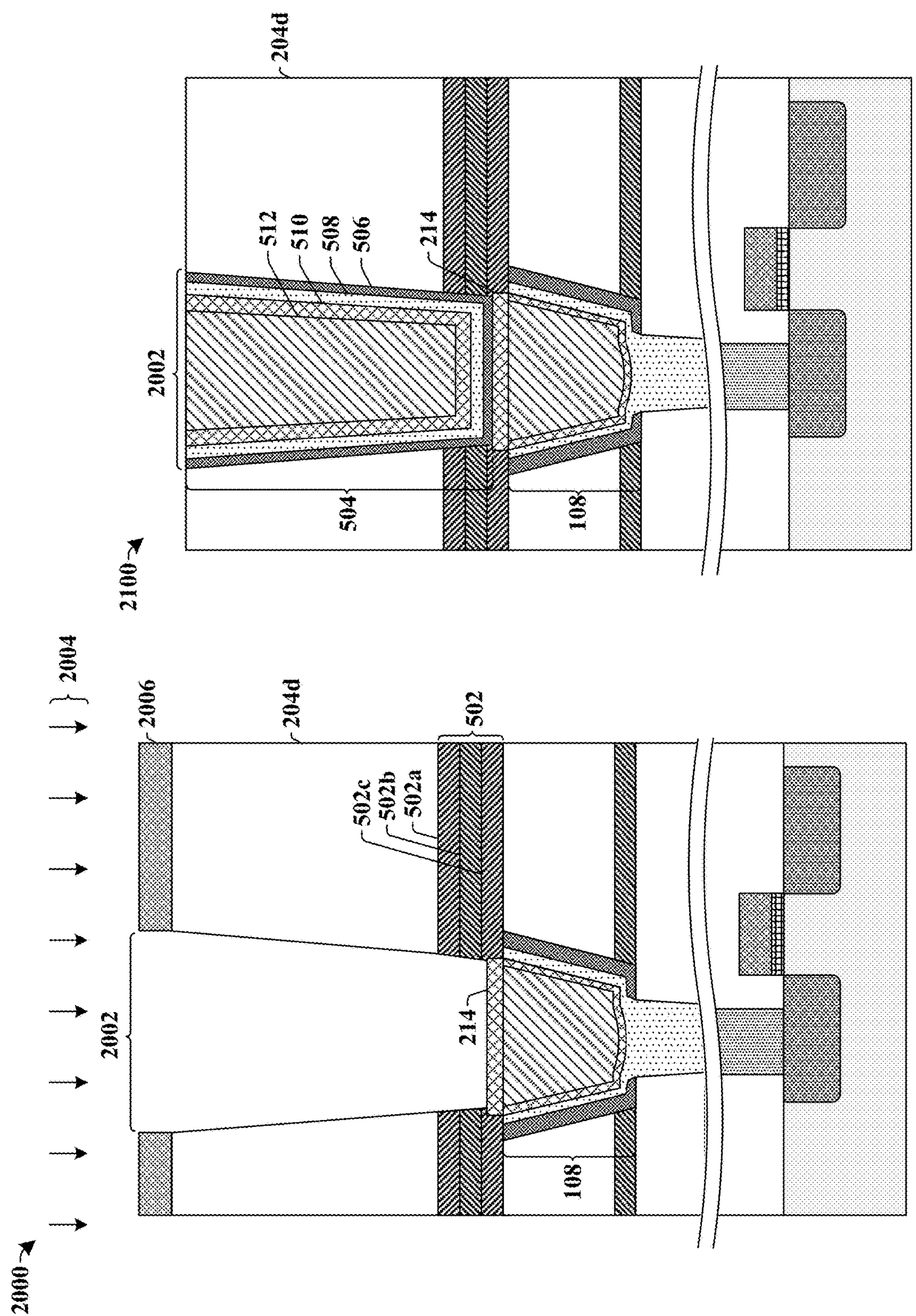

As shown in cross-sectional view 2000 of FIG. 20, the upper ILD layer 204*d* is patterned to define an upper interconnect opening 2002. In some embodiments, the upper ILD layer 204*d* may be patterned by selectively exposing the upper ILD layer 204*d* to a third etchant 2004 according to a second masking structure 2006. In some embodiments, the second masking structure 2006 may comprise a photoresist layer, a hard mask layer, or the like. In various embodiments, the third etchant 2004 may comprise a dry etchant (e.g., having a chlorine etching chemistry, a fluorine etching chemistry, or the like) or a wet etchant (e.g., comprising hydrofluoric acid, potassium hydroxide, or the like).

As shown in cross-sectional view 2100 of FIG. 21, an upper interconnect 504 is formed within the upper interconnect opening 2002. The upper interconnect 504 may be formed to be separated from the upper ILD layer 204*d* by way of an upper barrier layer 506. In some embodiments, the upper barrier layer 506 is formed by depositing an upper barrier layer within the upper interconnect opening 2002. The upper interconnect 504 is subsequently formed by forming a first upper liner layer onto the upper barrier layer and within the upper interconnect opening 2002, forming a second upper liner layer onto the first upper liner layer and within the upper interconnect opening 2002 and forming an upper conductive material onto the second upper liner layer and within the upper interconnect opening 2002. After formation of the upper conductive material, a planarization process (e.g., a CMP process) may be performed to remove excess of the upper conductive material, the first upper liner, the second upper liner, and/or the upper barrier layer from over the upper ILD layer 204*d*. The planarization process defines the upper interconnect 504 to have a first upper liner 508 over the upper barrier layer 506, a second upper liner 510 over the first upper liner 508, and an upper conductive interior 512 over the second upper liner 510.

The upper barrier layer, the first upper liner layer, the second upper liner layer, and the upper conductive material may be formed by way of deposition processes (e.g., CVD, PVD. PE-CVD, or the like). In some embodiments, the upper barrier layer may comprise tantalum, titanium, tantalum nitride, titanium nitride, or the like. In various embodiments, the first upper liner layer may comprise tungsten, ruthenium, cobalt, or the like. In some embodiments, the second upper liner layer may comprise a different material than the first upper liner. In various embodiments, the second upper liner layer may comprise tungsten, ruthenium, cobalt, or the like. In various embodiments, the upper conductive material may comprise copper, aluminum, or the like.

Figure 22:
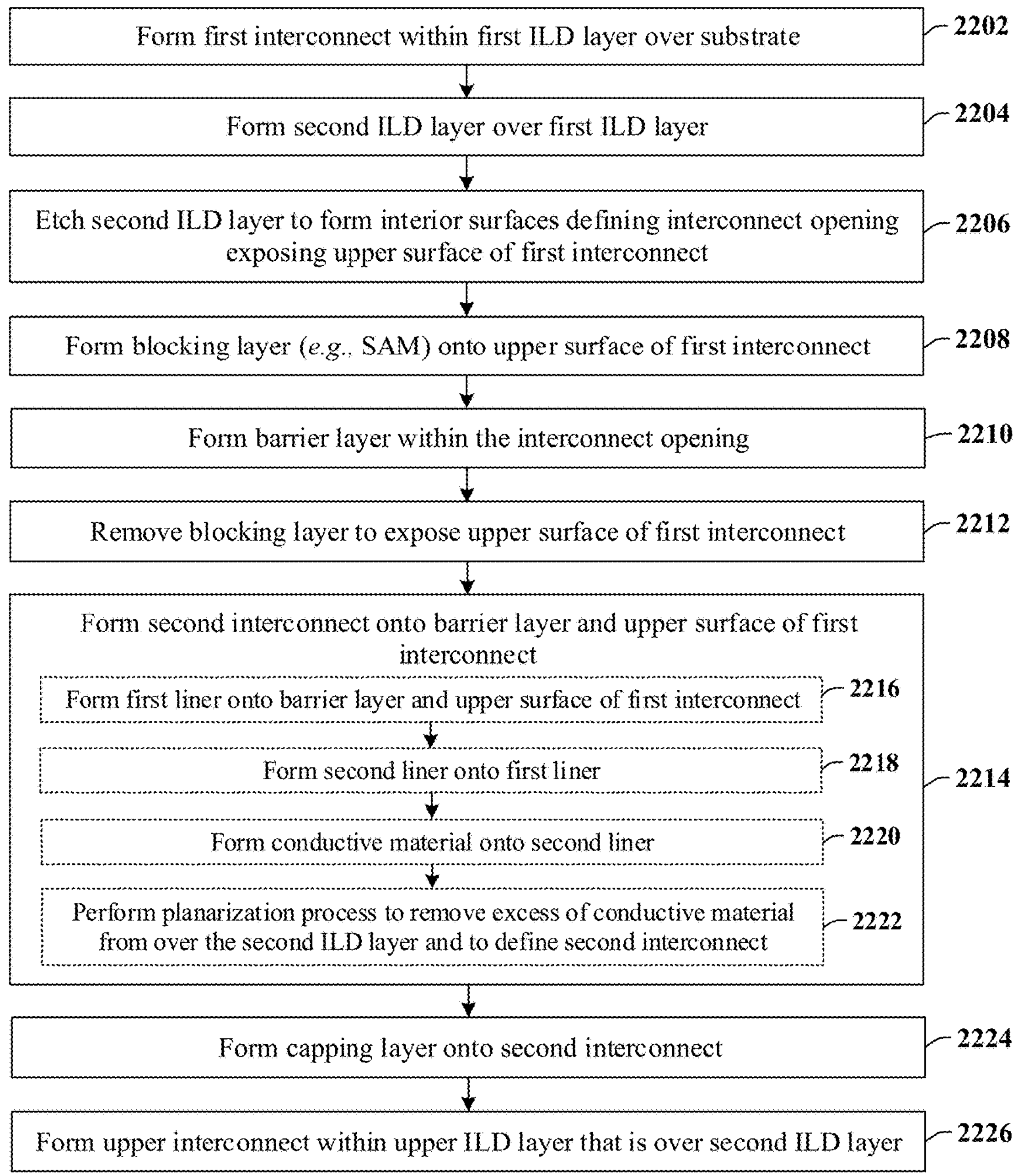
FIG. 22 illustrates a flow diagram of some embodiments of a method of forming an integrated chip having interconnects that meet at a barrier free interface.

FIG. 22 illustrates a flow diagram of some embodiments of a method 2200 of forming an integrated chip having interconnects that meet at a barrier free interface.

While the disclosed method 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2202, a first interconnect is formed within a first inter-level dielectric (ILD) layer over a substrate. FIGS. 6-7 illustrate cross-sectional views 600-700 of some embodiments corresponding to act 2202.

At act 2204, a second ILD layer is formed over the first ILD layer. FIG. 8 illustrates a cross-sectional view 800 of some embodiments corresponding to act 2204.

At act 2206, the second ILD layer is etched to form interior surfaces defining an interconnect opening exposing an upper surface of the first interconnect. FIGS. 8-10 illustrate cross-sectional views 800-1000 of some embodiments corresponding to act 2206.

At act 2208, a blocking layer is formed onto upper surface of first interconnect. In some embodiments, the blocking layer may comprise a self-assembled monolayer (SAM). FIG. 11 illustrates a cross-sectional view 1100 of some embodiments corresponding to act 2208.

At act 2210, a barrier layer is selectively formed within the interconnect opening. FIG. 12 illustrates a cross-sectional view 1200 of some embodiments corresponding to act 2210.

At act 2212, the blocking layer is removed to expose the upper surface of the first interconnect. FIG. 13 illustrates a cross-sectional view 1300 of some embodiments corresponding to act 2212.

At act 2214, a second interconnect is formed onto the barrier layer and onto the upper surface of the first interconnect. In some embodiments, the second interconnect may be formed according to acts 2216-2222.

Figure 14:
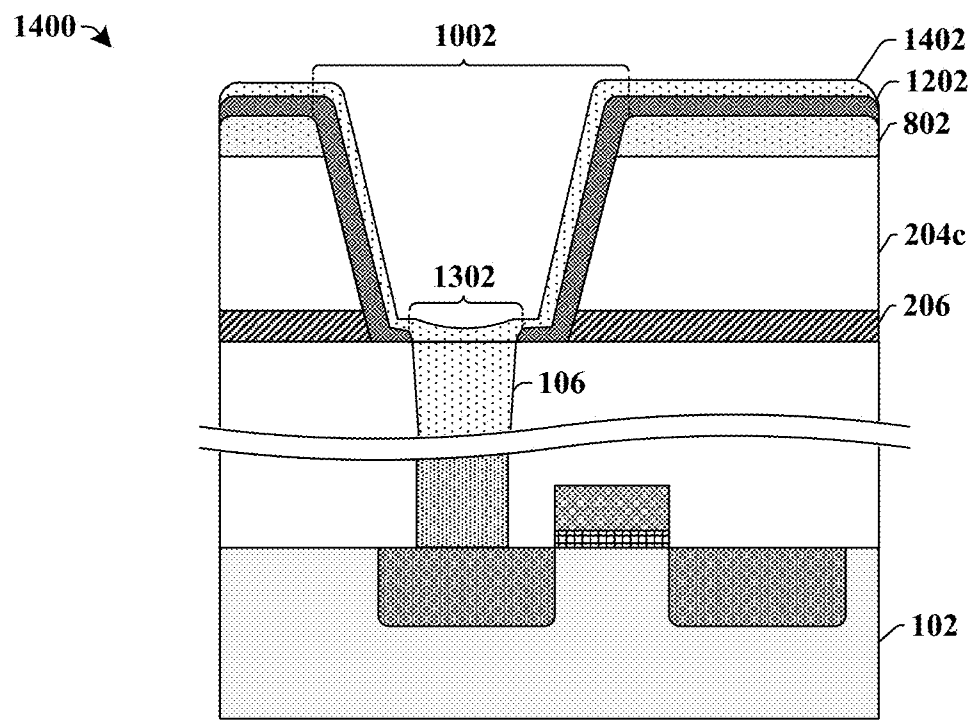

At act 2216, a first liner is formed onto the barrier layer and the upper surface of the first interconnect. FIG. 14 illustrates a cross-sectional view 1400 of some embodiments corresponding to act 2216.

At act 2218, a second liner is formed onto the first liner. FIG. 15 illustrates a cross-sectional view 1500 of some embodiments corresponding to act 2218.

At act 2220, a conductive material is formed onto the second liner. FIG. 16 illustrates a cross-sectional view 1600 of some embodiments corresponding to act 2220.

At act 2222, a planarization process is performed to remove excess of the conductive material from over the second ILD layer and to define a second interconnect. FIG. 17 illustrates a cross-sectional view 1700 of some embodiments corresponding to act 2222.

At act 2224, a capping layer is formed onto the second interconnect. FIG. 18 illustrates a cross-sectional view 1800 of some embodiments corresponding to act 2224.

At act 2226, an upper interconnect is formed within an upper ILD layer over the second ILD layer. FIGS. 19-21 illustrate cross-sectional views 1900-2100 of some embodiments corresponding to act 2226.

Accordingly, in some embodiments, the present disclosure relates to an integrated chip having an interconnect structure that does not have a barrier layer vertically separating an interconnect from an underlying interconnect.

In some embodiments, the present disclosure relates to an integrated chip. The integrated chip includes a first interconnect disposed within an inter-level dielectric (ILD) structure over a substrate; a barrier layer disposed along sidewalls of the ILD structure and having sidewalls defining an opening over the first interconnect; and a second interconnect disposed on the barrier layer, the second interconnect extending through the opening in the barrier layer and to the first interconnect. In some embodiments, the barrier layer is disposed on an upper surface of the ILD structure, the upper surface being laterally between the sidewalls of the ILD structure and the first interconnect. In some embodiments, the second interconnect includes a first liner that is arranged on the barrier layer and that surrounds a conductive interior. In some embodiments, the first interconnect and the first liner include a same material; and the conductive interior and the first liner include a different material. In some embodiments, the integrated chip further includes a second liner disposed on the first liner and surrounding the conductive interior. In some embodiments, the integrated chip further includes a capping layer arranged on the conductive interior and the second liner, the capping layer and the second liner including a same material. In some embodiments, the barrier layer is laterally outside of the capping layer. In some embodiments, the first liner includes a lower surface resting on the barrier layer and a protrusion extending outward from the lower surface and through the barrier layer.

In other embodiments, the present disclosure relates to an integrated chip. The integrated chip includes a first interconnect disposed within a first inter-level dielectric (ILD) layer over a substrate; a second ILD layer disposed over the first ILD layer; a barrier layer extending along a sidewall of the second ILD layer and along an upper surface of the first ILD layer; and a first liner disposed on the barrier layer and surrounding a conductive interior, the first liner extends through the barrier layer to the first interconnect. In some embodiments, the barrier layer includes a vertically extending segment disposed along the sidewall of the second ILD layer and a horizontally extending segment protruding outward from the vertically extending segment towards the first interconnect. In some embodiments, the first liner has a lower resistivity than the barrier layer. In some embodiments, the first interconnect and the first liner are a same material, which continuously extends from a bottom of the first interconnect to a top of the second ILD layer. In some embodiments, the barrier layer has sidewalls that are separated by a distance that is substantially equal to a width of a top surface of the first interconnect. In some embodiments, the conductive interior is vertically closer to the first interconnect along a center of a bottom of the conductive interior than along bottom outer edges of the conductive interior. In some embodiments, the conductive interior includes a lower surface directly over the barrier layer and a protrusion extending outward from the lower surface, the protrusion being directly over the first interconnect. In some embodiments, a bottom surface of the barrier layer defines a closed loop surrounding the first liner as viewed from a plan-view of the barrier layer.

In other embodiments, the present disclosure relates to a method of forming an integrated chip. The method includes forming a first interconnect within a first inter-level dielectric (ILD) layer over a substrate; forming a second ILD layer over the first ILD layer; patterning the second ILD layer to form sidewalls defining an interconnect opening that exposes an upper surface of the first interconnect; forming a blocking layer onto the upper surface of the first interconnect, the blocking layer laterally separated from the sidewalls of the second ILD layer; forming a barrier layer within the interconnect opening; removing the blocking layer to expose the upper surface of the first interconnect; and forming a second interconnect within the interconnect opening. In some embodiments, the blocking layer is removed after forming the barrier layer within the interconnect opening. In some embodiments, the blocking layer includes a self-assembled monolayer. In some embodiments, the method further includes forming a first liner onto the barrier layer and directly contacting the upper surface of the first interconnect; forming a conductive material onto the first liner; and performing a planarization process to remove part of the conductive material from over the second ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:

forming a first interconnect within a first inter-level dielectric (ILD) layer over a substrate;

forming a second ILD layer over the first ILD layer;

patterning the second ILD layer to form an interconnect opening that exposes the first interconnect;

forming a blocking layer onto the first interconnect;

forming a barrier layer within the interconnect opening, wherein a part of the first ILD layer is exposed laterally between the blocking layer and the second ILD layer before forming the barrier layer;

removing the blocking layer to expose the first interconnect; and forming a second interconnect within the interconnect opening.

2. The method of claim 1, wherein an entirety of the blocking layer is confined directly above the first interconnect.

3. The method of claim 1, further comprising:

forming an etch stop layer onto the first ILD layer; and forming the second ILD layer onto the etch stop layer, wherein the blocking layer is laterally separated from the etch stop layer by non-zero spaces.

4. The method of claim 1, wherein the blocking layer is a self-assembled monolayer.

5. The method of claim 1, wherein the blocking layer is formed prior to forming the barrier layer; and wherein the blocking layer is removed after forming the barrier layer.

6. A method of forming an integrated chip, comprising:

forming a conductor on a substrate;

forming a dielectric over the conductor;

etching the dielectric to form an interconnect opening that exposes the conductor;

forming a blocking layer onto the conductor;

forming a barrier layer within the interconnect opening, wherein the barrier layer is formed using an atomic layer deposition process that introduces a first precursor gas into a processing chamber and subsequently introduces a second precursor gas into the processing chamber, wherein the first precursor gas is not configured to adhere to the blocking layer;

removing the blocking layer to form an aperture extending through the barrier layer to the conductor; and forming an interconnect within the interconnect opening and the aperture.

7. The method of claim 6, wherein the blocking layer comprises an organic material.

8. The method of claim 6, wherein the blocking layer is a silane or a thiolate.

9. The method of claim 6, wherein the blocking layer has a smaller width than the interconnect opening.

10. An integrated chip, comprising:

a first interconnect disposed within an inter-level dielectric (ILD) structure over a substrate;

a barrier layer disposed within the ILD structure;

a second interconnect disposed on the barrier layer and extending through the barrier layer to the first interconnect, wherein a bottommost surface of the barrier layer vertically contacts an upper surface of the ILD structure and laterally extends past an interior sidewall of the barrier layer that faces the second interconnect;

wherein the second interconnect comprises a first conductive liner on the barrier layer, a second conductive liner on the first conductive liner, and a conductive core surrounded by the second conductive liner, the second conductive liner comprising a different material than the conductive core; and wherein the barrier layer comprises tantalum nitride, the first conductive liner comprises ruthenium, the second conductive liner comprises cobalt, and the conductive core comprises copper.

11. The integrated chip of claim 10, wherein the ILD structure comprises a first ILD layer surrounding the first interconnect and a second ILD layer surrounding the second interconnect, an upper surface of the first ILD layer being arranged laterally between an outer sidewall of the first interconnect and an interior sidewall of the second ILD layer.

12. The integrated chip of claim 10, wherein the first interconnect comprises a conductive material contacting lower sidewalls of the ILD structure, the second interconnect having a bottom surface that is completely confined over the conductive material.

13. The integrated chip of claim 10, wherein the barrier layer is completely laterally outside of the first interconnect.

14. The integrated chip of claim 10, wherein the second interconnect comprises a curved lower surface facing the first interconnect.

15. The integrated chip of claim 10, wherein the barrier layer comprises a vertically extending segment and a horizontally extending segment protruding outward from a sidewall of the vertically extending segment, the horizontally extending segment having different heights at different lateral positions.

16. The integrated chip of claim 10, further comprising:

a metal capping layer physically contacting a top of the second interconnect, wherein a top surface of the barrier layer is laterally outside of the metal capping layer and vertically below a lower surface of the metal capping layer facing the top of the second interconnect, and wherein the metal capping layer and the second conductive liner are a same material.

17. The integrated chip of claim 10, wherein the first interconnect and the first conductive liner are a same material.

18. The integrated chip of claim 10, wherein a metal capping layer physically contacts tops of the conductive core and the second conductive liner, a top surface of the barrier layer being laterally outside of the metal capping layer and vertically below a lower surface of the metal capping layer facing the top of the conductive core.

19. The integrated chip of claim 10, wherein the barrier layer is substantially symmetric about a line bisecting the second interconnect.

20. The integrated chip of claim 10, wherein the bottommost surface of the barrier layer vertically contacts the upper surface of the ILD structure along opposing sides of the first interconnect.

* * * * *